(12) United States Patent
Suzuki et al.

(10) Patent No.: US 7,067,826 B2
(45) Date of Patent: Jun. 27, 2006

(54) POSITION DETECTION METHOD AND APPARATUS

(75) Inventors: Takehiko Suzuki, Saitama (JP); Hideki Ina, Kanagawa (JP); Koichi Sentoku, Tochigi (JP); Satoru Oishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 330 days.

(21) Appl. No.: 10/151,151

(22) Filed: May 21, 2002

(65) Prior Publication Data

US 2002/0175300 A1    Nov. 28, 2002

(30) Foreign Application Priority Data

May 22, 2001   (JP)   ............... 2001-151876

(51) Int. Cl.
*G01N 21/00*  (2006.01)
(52) U.S. Cl. ............... 250/491.1; 250/492.1; 250/492.22
(58) Field of Classification Search ............ 356/400, 356/401, 620; 250/491.1, 492.1, 492.22; 382/294; 378/34

See application file for complete search history.

(56) References Cited

U.S. PATENT DOCUMENTS

| | | | |
|---|---|---|---|
| 4,861,162 A | 8/1989 | Ina | 356/401 |
| 5,309,197 A | 5/1994 | Mori et al. | 355/53 |
| 5,506,684 A * | 4/1996 | Ota et al. | 356/401 |
| 5,549,994 A | 8/1996 | Watanabe et al. | 430/5 |
| 5,751,404 A * | 5/1998 | Murakami et al. | 355/53 |
| 6,154,281 A * | 11/2000 | Sentoku et al. | 356/401 |
| 6,337,162 B1 * | 1/2002 | Irie | 430/5 |
| 6,359,678 B1 * | 3/2002 | Ota | 355/53 |
| 6,483,571 B1 * | 11/2002 | Shiraishi | 355/53 |
| 6,509,956 B1 * | 1/2003 | Kobayashi | 355/55 |
| 6,788,393 B1 * | 9/2004 | Inoue | 355/72 |
| 2001/0055117 A1 * | 12/2001 | Mizutani | 356/401 |
| 2002/0009175 A1 * | 1/2002 | Kurosawa | 378/34 |
| 2002/0041368 A1 * | 4/2002 | Ota et al. | 355/55 |
| 2002/0176096 A1 * | 11/2002 | Sentoku et al. | 356/620 |
| 2003/0048960 A1 * | 3/2003 | Outsuka | 382/294 |

FOREIGN PATENT DOCUMENTS

JP          61-263127          11/1986

\* cited by examiner

*Primary Examiner*—Nikita Wells
*Assistant Examiner*—Anthony Quash
(74) *Attorney, Agent, or Firm*—Fitzpatrick, Cella, Harper & Scinto

(57) ABSTRACT

A reticle stage reference mark 3 of material having high reflectivity to alignment illumination light is provided on a reticle 5, and a chuck mark 8 of material having high reflectivity to the alignment illumination light is provided on a wafer chuck 11. A relative position of the reticle stage reference mark 3 to the chuck mark 8 is detected by using a first position detection optical system 1 and a first illumination optical system 2, and relative alignment is performed between the reticle 5 and a wafer 10.

15 Claims, 11 Drawing Sheets

FIG. 9

| | |
|---|---|
| URL | http://www.maintain.co.jp/db/input.html |

TROUBLE DB INPUT SCREEN IMAGE

DATE  2000/3/15 ~404
MODEL ✱✱✱✱✱✱✱✱✱ ~401
CASE  MALFUNCTION (BOOT-UP ERROR) ~403
DEVICE S/N  465NS4580001 ~402
EMERGENCY LEVEL  D ~405
PROBLEM  LED FLASHES ON AND OFF WHEN POWER IS TURNED ON ~406
REMEDY  TURN POWER ON AGAIN (DEPRESS RED BUTTON AT POWER-ON) ~407
PROGRESS  TEMPORARY MEASURE TAKEN ~408

[SEND] [RESET]    410    411    412
LINK TO RESULT LIST DATABASE    SOFTWARE LIBRARY    OPERATION GUIDE

SEMICONDUCTOR DEVICE FABRICATION FLOW

POSITION DETECTION METHOD AND APPARATUS

FIELD OF THE INVENTION

The present invention relates to a position detection method and an apparatus appropriate for an exposure apparatus and an exposure method for the transfer of a fine circuit pattern. More particularly, the present invention is preferably applicable to the alignment of a substrate such as a wafer in an exposure apparatus using extreme ultraviolet light (EUV light).

BACKGROUND OF THE INVENTION

Conventionally, as a lithography technique for the fabrication of fine semiconductors, such as a semiconductor memory or a logic circuit, projection reduction exposure using ultraviolet light has been employed.

The minimum size which can be transferred by the projection reduction exposure is proportional to the wavelength of light of the transfer, and inversely proportional to the numerical aperture of the projection optical system. Accordingly, to transfer a fine circuit pattern, light having a short wavelength such as a mercury lamp i-ray (wavelength: 365 nm), a KrF excimer laser (wavelength: 248 nm), and an ArF excimer laser (wavelength: 193 nm) are employed. Thus, the wavelength of ultraviolet light has been shortened.

However, as finer semiconductor devices are rapidly developed, the transfer of such finer devices cannot be handled without difficulty in the lithography using ultraviolet light. Accordingly, to efficiently print a very fine circuit pattern, less than 1 μm, a projection reduction exposure apparatus using extreme ultraviolet light (EUV light) having a wavelength of 10 to 15 nm, which is further shorter than that of the ultraviolet ray, has been developed.

In an EUV light area, as the amount of absorption by material is very large, a lens optical system utilizing light refraction, which is used for visible and ultraviolet light, is impractical. Accordingly, the exposure apparatus using EUV light employs a reflection optical system. In this case, a reflective type reticle where a pattern to be transferred is formed by light absorbing material on a mirror is employed as a plate.

As a reflection optical device constructing the EUV exposure apparatus, a multilayer mirror and an oblique incidence total reflection mirror are known. In the EUV area, as a substantial part of the refractive index is slightly less than 1, total reflection occurs by using EUV light as oblique incidence as close to the surface as possible. Generally, in oblique incidence, within several degrees from the surface, a high refractive index of several tens of % or higher can be obtained. However, as the freedom of optical design is limited, it is difficult to use the total reflection mirror in the projection optical system.

The mirror for the EUV light used at an incident angle close to direct incidence is a multilayer mirror where two types of materials having different optical constants are alternately laminated. For example, molybdenum and silicon are alternately laminated on the surface of a glass substrate, which is ground to have a precise surface shape. The thickness of the molybdenum layer is, e.g., 0.2 nm, that of the silicon layer, e.g., 0.5 nm, and the number of layers is about twenty pairs. The sum of the thicknesses of the two types of layers is called a film period. In the above example, as the film period, 0.2 nm+0.5 nm=0.7 nm holds.

When the EUV light is incident on the multilayer mirror, EUV light having a particular wavelength is reflected. Assuming that the incident angle is θ, the EUV light wavelength, λ, and the film period, d, only narrow band EUV light, mainly having the wavelength λ approximately satisfying the relation by Bragg's equation $$2 \times d \times \sin\theta = \lambda$$

is efficiently reflected. The bandwidth at this time is about 0.6 to 1 nm.

The reflectivity of the reflected EUV light is about 0.7 at the maximum. EUV light, which has not been reflected, is absorbed in the multilayer or the substrate, and most of the energy of the light becomes heat.

As light loss of the multilayer mirror is greater in comparison with a visible light mirror, the number of mirrors must be a minimum number. To realize a wide exposure area with a small number of mirrors, employed is a method for transfer (scan exposure) in a wide area by simultaneously scanning a reticle and a wafer using only a slim ring area (ring field) away from an optical axis by a predetermined distance.

FIG. 6 is a schematic diagram of the conventional projection reduction exposure apparatus using EUV light. The exposure apparatus comprises an EUV light source 50, an illumination optical system 60, a reflective type reticle 81, a projection optical system 70, a reticle stage 80, a wafer stage 85, an off-axis alignment optical system (detection mechanism) 90, a vacuum system, and the like.

The EUV light source 50 is, e.g., a laser plasma light source. Light from a high-intensity pulse laser 53 is gathered by a light gathering lens 54, emitted on a target material placed in a vacuum container 52 supplied from a target supply device 51, to cause high temperature plasma 55, and EUV light having a wavelength of, e.g., about 13 nm, radiated from the plasma is utilized. As the target material, a metal thin film, inertia gas, a liquid drop, or the like, is used. The target material is supplied by gas jet means, or the like, into the vacuum container 52. To increase the mean intensity of the radiated EUV light, it is preferable that the repetition frequency of the pulse laser 53 is high. Generally, the pulse laser is operated by a several kHz repetition frequency.

The illumination optical system 60 comprises plural multilayer or oblique incidence first to third mirrors 61 to 63, an optical integrator 64, and the like. The first-stage light gathering mirror 61 corrects EUV light approximately isotropically radiated from the laser plasma 53. The optical integrator 64 uniformly illuminates a mask with a predetermined numerical aperture. Further, an aperture 65 to limit an illuminated area of the reticle surface to a circular shape is provided in the position of the illumination optical system 60 conjugate with the reticle 81.

The projection optical system 70 uses plural mirrors 71 to 74. As the number of mirrors is small, the efficiency of use of EUV light is high, however, the aberration cannot be easily corrected. The number of mirrors necessary for aberration correction is about four to six. The shape of the mirror reflection surface is a spherical surface such as a convex or concave surface or an aspherical surface. The numerical aperture NA is about 0.1 to 0.3.

The mirror is obtained by grinding and polishing a substrate of a material having a high rigidity and hardness and a low thermal expansion rate, such as low-expansion glass or silicon carbine, to form a predetermined reflection surface shape, then forming a multilayer film of molybdenum, silicon, and the like, on the reflection surface. If the incident angle is not constant depending on a position within the mirror surface, as it is apparent from the above-described Bragg's equation, the wavelength of EUV light having the reflectivity, which increases depending on the position of the multilayer film having a constant film period, is shifted. Accordingly, the mirror surface must have a film period distribution to attain efficient reflection of the EUV light of the same wavelength within the mirror surface.

The reticle stage 80 and the wafer stage 85 have a mechanism to scan in synchronization with each other at a speed rate proportional to a reduction scaling factor. In the reticle 81 or the wafer 86 surface, a scanning direction is X, a direction vertical to the scanning direction is Y, and a direction vertical to the reticle 81 or the wafer 86 surface is Z.

The reticle 81 is held on a reticle chuck 82 on the reticle stage 80. The reticle stage 80 has a mechanism to move in the direction X at a high speed. Further, the reticle stage has a mechanism to slightly move in the directions X, Y and Z and rotational directions about the respective axes for positioning of the reticle 81. The position and posture of the reticle stage 80 is measured by a laser interferometer, and the position and the posture are controlled in accordance with the result of the measurement.

The wafer 86 is held on the wafer stage 85 by the wafer chuck 88. The wafer stage 85 has a mechanism similar to that of the reticle stage 80 to move in the direction X at a high speed. Further, the wafer stage has a mechanism to slightly move in the directions X, Y and Z and rotational directions about the respective axes for positioning of the wafer. The position and posture of the wafer stage 85 is measured by a laser interferometer, and the position and the posture are controlled in accordance with the result of measurement.

The alignment detection mechanism 90, as in the case of, e.g., an ArF exposure apparatus, performs wafer alignment by an off-axis bright field illumination image processing detection system while holding a predetermined baseline amount.

Further, a focus position in the direction Z is measured by a focus position detection mechanism 91, and the position and angle of the wafer stage 85 are controlled, thereby the wafer surface is held in an image-formation position by the projection optical system 70 during exposure.

When one scan exposure has been completed on the wafer 86, the wafer stage 85 step-moves in the directions X and Y to the next scan exposure start position. Again, the reticle stage 80 and the wafer stage 85 scan in synchronization with each other in the direction X at the speed rate proportional to the reduction scaling factor of the projection optical system 70.

In this manner, the synchronized scanning in the status wherein a reduced projection image of the reticle 81 is formed on the wafer 86 is repeated (step and scan). Thus, the transfer pattern of the reticle 81 is transferred onto the entire surface of the wafer 86.

The off-axis bright field illumination image processing detection system is used as the alignment detection mechanism as in the case of the ArF exposure apparatus, however, to address a requirement for finer semiconductor devices, alignment in higher precision must be realized. Accordingly, the stability of the baseline is required equally or more in comparison with the ArF exposure apparatus.

However, in the EUV exposure apparatus, a measurement system to automatically measure the baseline, especially, means for measuring the reticle and wafer, or the like, has not been proposed.

The automatic measuring system has not been proposed since a relative positional alignment (hereinafter, referred to as "TTL (Through The Lens) alignment") between the reticle and the wafer via the projection optical system has the following problems.

In a case wherein the TTL alignment is performed in the EUV exposure apparatus, illumination light to detect an alignment mark (e.g., as the wavelength used is not EUV, it is non-exposure light) is reflected from the reflective type reticle and passed through the multilayer mirror optical system. The light illuminates a wafer alignment mark on the wafer, and then, reflected light from the wafer alignment mark is again passed through the multilayer mirror optical system and the reflective type reticle. Then, the alignment mark is detected by the alignment detection optical system having an image formation optical system and an image sensing device.

In this manner, if the TTL alignment is performed by the non-exposure light via the reflective type reticle and the multilayer mirror, as the reflective type reticle and the multilayer mirror are optimized to attain a high reflectivity by the EUV light, a sufficient reflectivity cannot be attained by the non-exposure illumination light. Accordingly, there is a possibility that high precision alignment cannot be performed.

Further, in the case of an off-axis method, the stability of the baseline is required. To attain the stability of the baseline, it is necessary to use a material having a high mechanical rigidity and low thermal sensitivity and to attain ultra stable heat distribution, which increase the cost of the apparatus.

SUMMARY OF THE INVENTION

The present invention has as its object to enable high-precision alignment between a plate, such as a reticle, and a substrate, such as a wafer, without expensive parts.

To attain the above object, provided is a position detection method for detecting positions of a reflective type plate and a substrate upon exposure-transfer of a pattern on the plate onto the substrate by emitting non-exposure light to the plate and the substrate and receiving reflected light from the plate and the substrate, the method comprising: a first position detection step of detecting a plate holding unit mark, being provided on a plate holding unit movable while holding the plate and having a predetermined reflection characteristic to the non-exposure light, and a substrate holding unit mark, being provided on a substrate holding unit movable while holding the substrate and having a predetermined reflection characteristic to the non-exposure light; and a relative position detection step of detecting a relative position of the plate to the substrate from a relative position of the plate holding unit mark to the substrate holding unit mark.

Further, preferably, a plate alignment mark is provided on the plate, and the method further comprises a second position detection step of detecting a relative position of the plate holding unit mark to the plate alignment mark.

Further, preferably, a substrate alignment mark is provided on the substrate, and the method further comprises a third position detection step of detecting a relative position of the substrate holding unit mark to the substrate alignment mark.

Further, preferably, at the first position detection step, the substrate holding unit mark is detected on-axis in the same position as an exposure position, and at the relative position detection step, relative alignment is made between the plate and the substrate by using positional information of the substrate holding unit mark.

Further, preferably, the non-exposure light is extreme ultraviolet light having a wavelength of 10 to 15 nm, and wherein the predetermined reflection characteristic is a reflectivity to the non-exposure light set to 95% or higher.

Further, preferably, the reflective type plate has a reflection portion of a multilayer structure.

Further, preferably, the substrate holding unit has a substrate chuck holding the substrate, and wherein the substrate holding unit mark is provided on the substrate chuck.

Further, preferably, at the first position detection step, the plate holding unit mark and the substrate holding unit mark are detected upon each exposure.

Further, provided is a position detection apparatus for detecting positions of a reflective type plate and a substrate upon exposure-transfer of a pattern on the plate onto the substrate by emitting non-exposure light to the plate and the substrate and receiving reflected light from the plate and the substrate, the apparatus comprising: a first position detection unit that detects a plate holding unit mark, being provided on a plate holding unit movable while holding the plate and having a predetermined reflection characteristic to the non-exposure light, and a substrate holding unit mark, being provided on a substrate holding unit movable while holding the substrate and having a predetermined reflection characteristic to the non-exposure light; and a relative position detection unit that detects a relative position of the plate to the substrate from a relative position of the plate holding unit mark to the substrate holding unit mark.

Further, preferably, a plate alignment mark is provided on the plate, and the apparatus further comprises a second position detection unit that detects a relative position of the plate holding unit mark to the plate alignment mark.

Further, preferably, a substrate alignment mark is provided on the substrate, and the apparatus further comprises a third position detection unit that detects a relative position of the substrate holding unit mark to the substrate alignment mark.

Further, preferably, the non-exposure light is extreme ultraviolet light having a wavelength of 10 to 15 nm, and the predetermined reflection characteristic is reflectivity to the non-exposure light set to 95% or higher.

Further, preferably, the reflective type plate has a reflection portion of a multilayer structure.

Further, preferably, the substrate holding unit has a substrate chuck holding the substrate, and the substrate holding unit mark is provided on the substrate chuck.

Further, preferably, the first position detection unit detects the plate holding unit mark and the substrate holding unit mark upon each exposure.

Further, provided is an exposure method for performing alignment between a plate and a substrate based on the relative position of the plate to the substrate detected by any one of the above position detection methods, and exposure-transferring a pattern on the plate onto the substrate.

Further, provided is an exposure apparatus comprising: the position detection apparatus according to any one of the above position detection methods; a moving control unit that performs alignment between the plate and the substrate by move-controlling the plate holding unit and the substrate holding unit based on a relative position of the plate to the substrate detected by the position detection apparatus; and an exposure control unit that exposure transfers the pattern on the plate onto the substrate in a status in which the plate and the substrate are aligned with each other.

More specifically, the present invention proposes a method for enabling high precision alignment independent of baseline stability by attaining high precision by using high alignment illumination light for TTL alignment. The TTL alignment is made between a reticle stage reference mark and a chuck mark. The reticle stage reference mark is formed on the reticle stage. The reticle stage reference mark has sufficiently high reflectivity of 95% or higher to the alignment illumination light. The relative position of the reticle to the reticle stage reference mark is ensured by the precision of the reticle stage drive.

The chuck mark is formed on the chuck to hold the wafer on the wafer stage. The chuck mark has sufficiently high reflectivity of 95% or higher to the alignment illumination light. The relative position of the wafer to the chuck mark is ensured by the precision of the wafer stage drive for wafer exposure or another stage drive.

In this manner, the TTL alignment is performed by using the reticle stage reference mark in place of the reticle. Accordingly, as the light quantity of the alignment illumination light is not reduced and the chuck mark is detected by the TTL alignment system, high precision alignment without a baseline is realized.

In general projection exposure apparatus, alignment between a reticle and a wafer via a projection lens is called TTL alignment, however, in the EUV exposure apparatus, as the projection optical system comprises a multilayer mirror optical system in place of the lens, alignment there cannot be called TTL alignment. However, in the present specification, the alignment via the multilayer mirror optical system is also defined as TTL alignment for the sake of simplicity of explanation.

The present invention is further applicable to a semiconductor device fabrication method comprising: a step of installing a fabrication apparatus group for performing various processes, including the above-mentioned exposure apparatus, in a semiconductor fabrication factory; and a step of fabricating a semiconductor device by performing plural processes by using the fabrication apparatus group. It is preferable that the method further comprises: a step of connecting the fabrication apparatus group by a local area network; and a step of performing data communication for transmission of information on at least one apparatus of the fabrication apparatus group between the local area network and an external network outside the semiconductor fabrication factory. In this case, maintenance information for the fabrication apparatus is obtained by accessing a database provided by a vendor or a user of the exposure apparatus via the external network, or production management is performed by data communication with a semiconductor fabrication factory other than the semiconductor fabrication factory via the external network.

The present invention is further applicable to a semiconductor fabrication factory having: a fabrication apparatus group including the above exposure apparatus; a local area network connected to the fabrication apparatus group; and a gateway that enables access from the local area network to an external network outside the factory, wherein data communication is performed for transmission of information on at least one apparatus of the fabrication apparatus group.

Further, the present invention is applicable to an exposure apparatus maintenance method for maintenance of the above-mentioned exposure apparatus installed in a semiconductor fabrication factory, the method comprising: a step of providing a maintenance database connected to an external network outside the semiconductor fabrication factory by a vendor or user of the exposure apparatus; a step of permitting access to the maintenance database from the semiconductor fabrication factory via the external network; and a step of transmitting maintenance information stored in the maintenance database to the side of the semiconductor fabrication factory via the external network.

Further, it may be arranged such that the exposure apparatus further comprises a display, a network interface and a computer that executes network software, wherein maintenance information for the exposure apparatus is transmitted via a computer network. Further, it is preferable that the network software provides a user interface on the display to access a maintenance database, provided by a vendor or user of the exposure apparatus, connected to an external network outside the factory having the exposure apparatus, and obtains information from the database via the external network.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 9 is a particular example of a user interface;

DETAILED DESCRIPTION OF THE PREFERRED EMBODIMENTS

Figure 1:
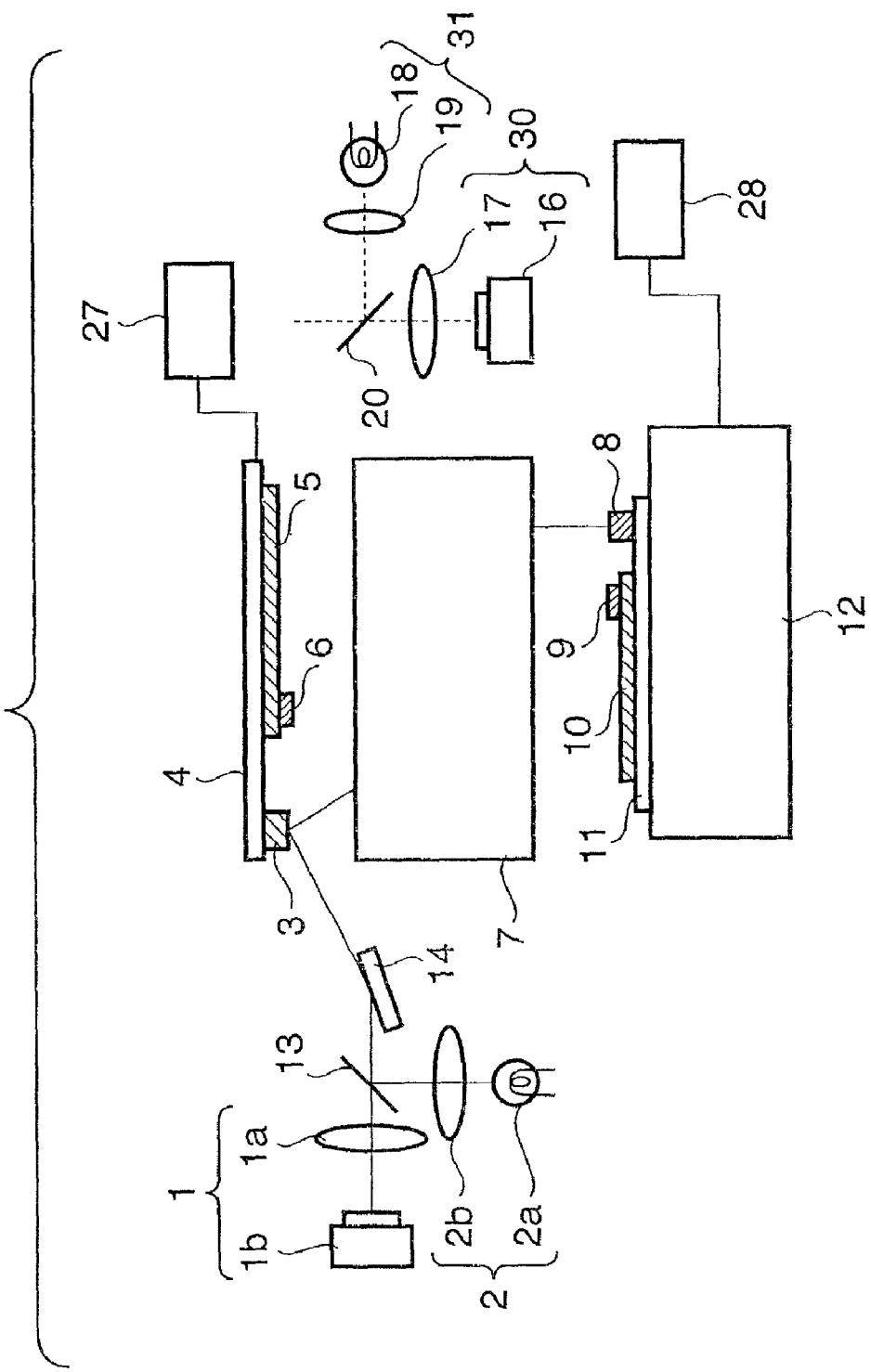
FIG. 1 is a schematic cross-sectional view of a position detection apparatus according to an embodiment of the present invention.

Preferred embodiments where the position detection method and apparatus of the present invention are applied to a semiconductor exposure apparatus will now be described in detail in accordance with the accompanying drawings.

In FIGS. 1 to 5, the exposure apparatus of the present embodiment has a first position detection optical system 1 and a first illumination optical system 2 (first position detection step, unit), a second position detection optical system 30 and a second position illumination optical system 31 (second position detection process, unit), a third position detection optical system 40 and a third illumination optical system 41 (third position detection step, unit), a moving stage 26, which moves a wafer chuck 11, holding a wafer 10 as a plate, to the third position detection optical system 40, a reticle stage 4, which is move-controlled while holding the reticle 5 as a reflective type plate, having a multilayer reflection portion, a multilayer mirror optical system 7, a wafer chuck 11 holding a wafer 10, and a wafer stage 12, which is move-controlled while carrying the wafer chuck 11 holding the wafer 10.

The reticle stage 4, the wafer stage 11 and the moving stage 26 are move-controlled by a stage controller (not shown) upon position detection of respective marks, alignment between the reticle 5 and the wafer 10, or exposure, to be described later.

The first position detection optical system 1 has an image sensing device 1a such as a CCD and an image formation optical system 1b, and the first illumination optical system 2 has a light source 2a to emit non-exposure light and a light gathering lens 2b. The second position detection optical system 30 has an image sensing device 16, such as a CCD and an image formation optical system 17, and the second illumination optical system 31 has a light source 18 to emit exposure light and a light gathering lens 19. The third position detection optical system 40 has an image sensing device 24 such as a CCD and an image formation optical system 25, and the third illumination optical system 41 has a light source 21 to emit exposure light and a light gathering lens 22.

Illumination light from the first illumination optical system 2 is reflected by a half mirror 13 and a mirror 14, and illuminates a reflective type alignment mark (hereinafter referred to as a "reticle stage reference mark") 3 provided on the reticle stage 4. Further, the illumination light reflected from the reticle stage reference mark 3 passes through the multilayer mirror optical system 7, and illuminates a chuck mark 8 on the wafer chuck 11 holding the wafer 10 as a substrate.

Further, illumination light from the second illumination optical system 31 is reflected by a half mirror 20, and illuminates the reticle stage reference mark 3 and the reticle alignment mark 6 on the reticle stage 4. Further, the illumination light reflected from the reticle stage reference mark 3 or the reticle alignment mark 6 passes through the half mirror 20, and is received by the image sensing device 16 and the image formation optical system 17.

Further, illumination light from the third illumination optical system 41 is reflected by a half mirror 23, and illuminates a reflective type chuck mark 8 provided on the wafer chuck 11 and a wafer alignment mark 9 provided on the wafer 10. Further, the illumination light reflected from the chuck mark 8 or the wafer alignment mark 9 passes through the half mirror 23, and is received by the image sensing device 24 and the image formation optical system 25.

The relative positional alignment between the reticle stage reference mark 3 and the chuck mark 8 is performed by detecting images of the reticle stage reference mark 3 and the chuck mark 8 illuminated by the first illumination optical system 2, calculating the relative position of the reticle stage reference mark 3 to the chuck mark 8 from positional information obtained by image processing in a positional information calculation unit (not shown) (relative position detection step, unit), and using the calculated relative positional information.

Further, the positional information calculation unit obtains positional information of the respective marks by performing image processing on the image of the mark detected by the second position detection optical system 30 and the second illumination optical system 31 and the image of the mark detected by the third position detection optical system 40 and the third illumination optical system 41, as well as the image of the mark detected by the first position detection optical system 1 and the first illumination optical system 2.

The reticle stage reference mark 3 comprises a member having sufficiently high reflectivity of 95% or higher as a reflection characteristic to the non-exposure alignment illumination light. The relative position of the reticle 4 to the reticle stage reference mark 3 is ensured by the precision of drive of the reticle stage drive 4.

Similarly, the chuck mark 8 comprises a member having sufficiently high reflectivity of 95% or higher as a reflection characteristic to the non-exposure alignment illumination light. The relative position of the wafer 10 to the chuck mark 8 is ensured by the precision of drive for wafer exposure or another wafer stage.

In this manner, the TTL alignment is performed by using the reticle stage reference mark in place of the reticle. As the light quantity of the alignment illumination light is not reduced and the chuck mark is detected by the TTL alignment system, high precision alignment without a baseline is realized.

The relative position of the reticle stage reference mark 3 to the reticle alignment mark 6 is detected in advance by a method to be described with reference to FIGS. 2 and 3. Further, the relative position of the chuck mark 8 to the wafer alignment mark 9 is detected in advance by a method to be described with reference to FIGS. 4 and 5.

In this manner, as the relative position of the reticle stage reference mark 3 to the reticle alignment mark 6, and the relative position of the chuck mark 8 to the wafer alignment mark 9, are detected in advance, relative alignment between the reticle 5 and the wafer 10 can be made by determining relative position of the reticle stage reference mark 3 to the chuck mark 8.

First, the method for previously determining the relative position of the reticle alignment mark 6 to the reticle stage reference mark 3 will be described with reference to FIGS. 2 and 3.

Figure 2:
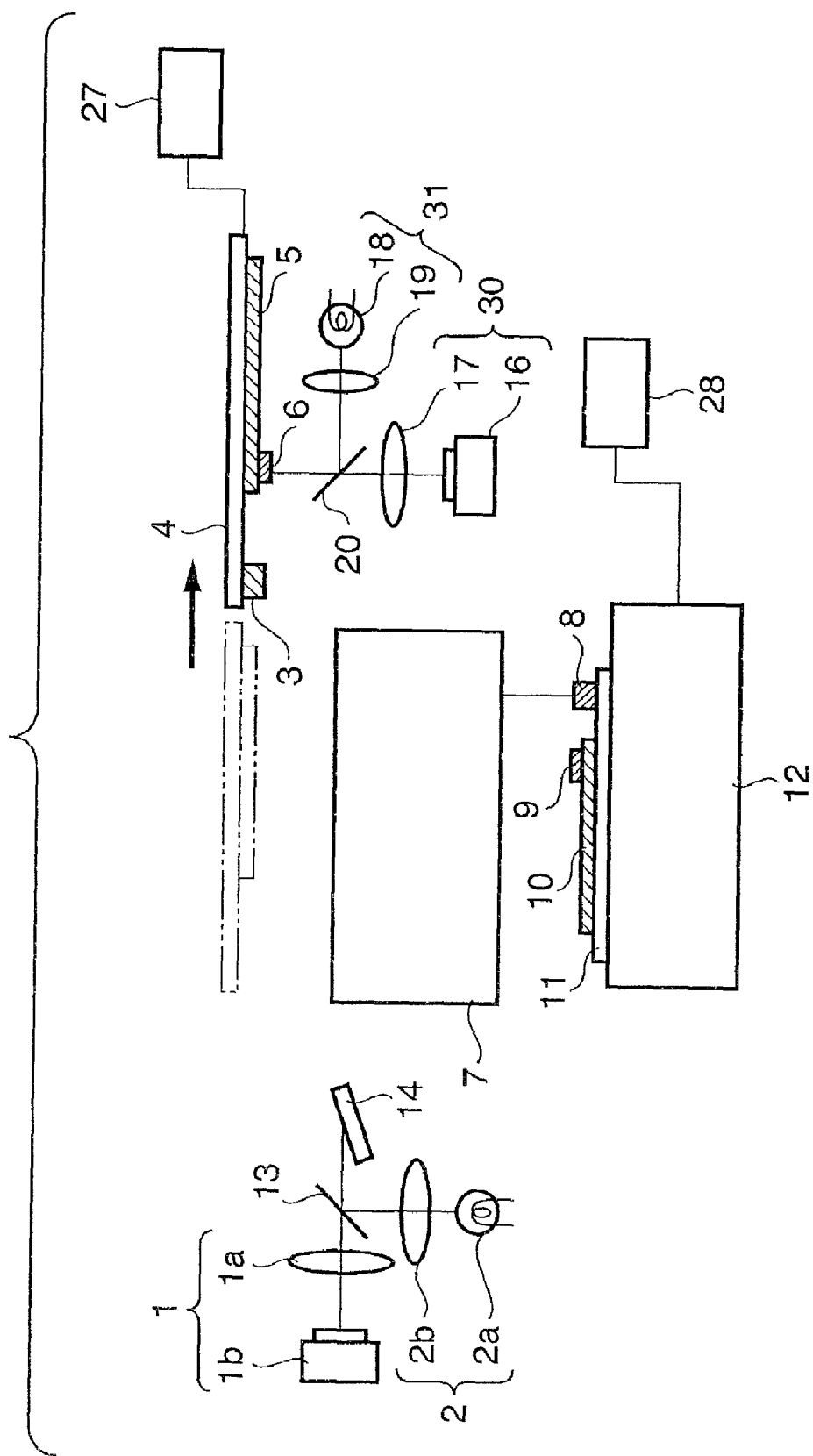
FIG. 2 is a schematic cross-sectional view showing detection of a reticle alignment mark on a reticle in the embodiment.

FIG. 2 shows the method for detecting the relative position of the reticle stage reference mark 3 provided on the reticle stage 4 to the reticle alignment mark 6 provided on the reticle 5. In the figure, the reticle alignment mark 6 on the reticle 5 is detected. In comparison with FIG. 1, the reticle 5 and the reticle stage reference mark 3 move by the drive by the reticle stage 4, and the image of the reticle alignment mark 6 is received by the image sensing device 16 of the second position detection optical system 30.

Figure 3:
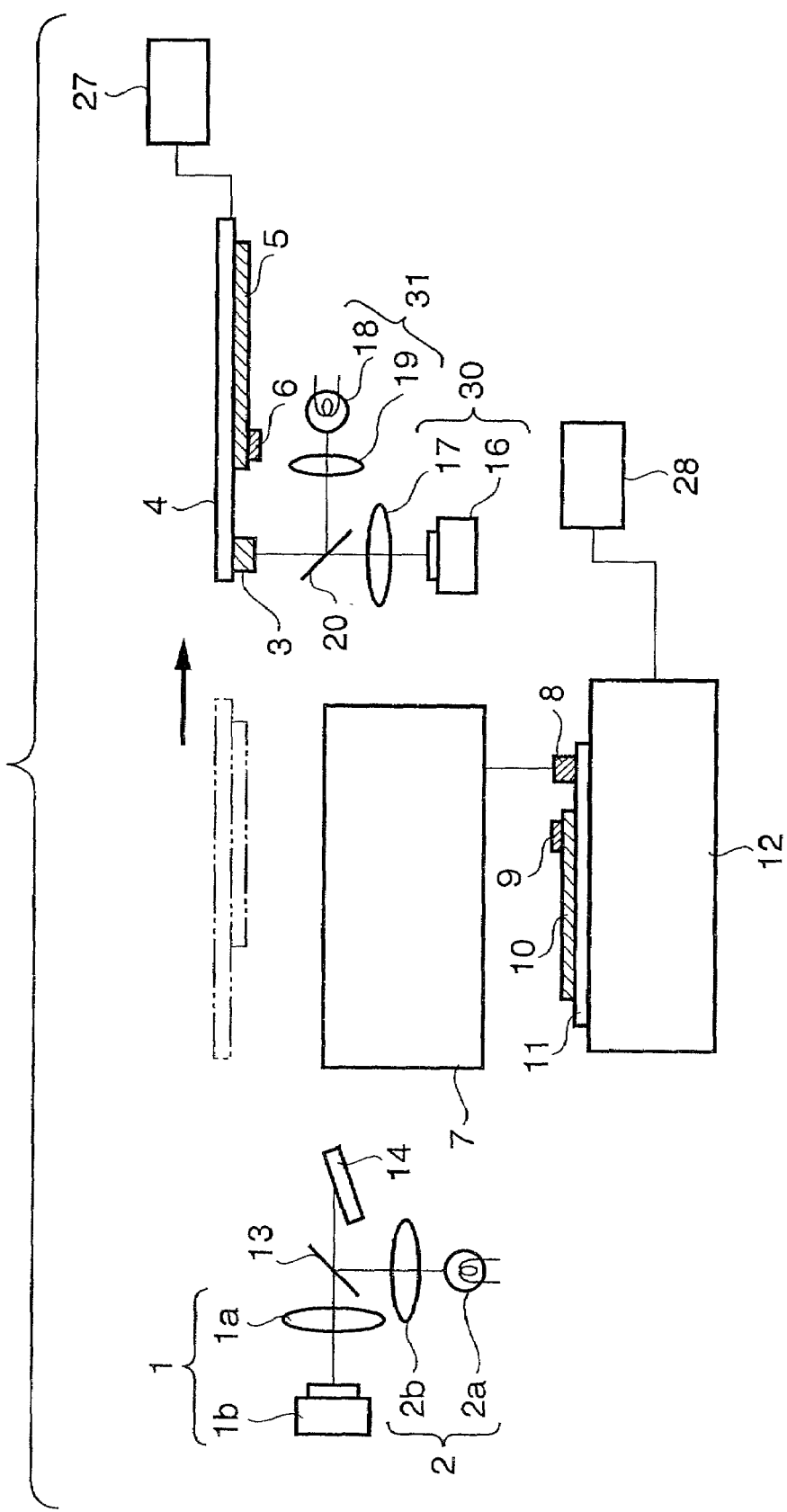
FIG. 3 is a schematic cross-sectional view showing detection of a reticle stage reference mark on a reticle stage in the embodiment.

FIG. 3 shows the method for detecting the relative position of the reticle stage reference mark 3 provided on the reticle stage 4 to the reticle alignment mark 6 provided on the reticle 5. In the figure, the reticle stage reference mark 3 on the reticle stage 4 is detected. In FIG. 3, in comparison with FIGS. 1 and 2, the drive by the reticle stage 4 is further made in an arrow direction, the reticle 5 and the reticle stage reference mark 3 further move, and the image of the reticle stage reference mark 3 is received by the image sensing device 16 of the second position detection optical system 30.

An example of the detection sequence will be described. First, the reticle stage 4 is moved in the status of FIG. 2, the reticle alignment mark 6 is moved to a mark detection position of the second position detection optical system 30, reflected light from illumination light of the second illumination optical system 31 is received by the second position detection optical system 30, the position of the reticle alignment mark 6 on the reticle 5 is detected by image processing, and the position of the reticle stage 4 at that time is stored into a reticle stage position storage device 27.

Next, the reticle stage 4 is moved to the status in FIG. 3, the reticle stage reference mark 3 is moved to the mark detection position of the second position detection optical system 30, the reflected light from illumination light of the second position detection optical system 31 is received by the second position detection optical system 30, the position of the reticle stage reference mark 3 on the reticle stage 4 is detected by image processing, and the position of the reticle stage 4 at that time is stored into the reticle stage position storage device 27.

Then, the relative position of the reticle stage reference mark 3 to the reticle alignment mark 6 is detected from the positional information of the reticle stage 4 upon detection of the respective marks detected by the second position detection optical system 30.

Note that the second position detection optical system 30, the second illumination optical system 31 and the half mirror 20 may have a moving-controllable mechanism.

Further, upon detection of the relative position of the reticle stage reference mark 3 to the reticle alignment mark 6, the heights of the two marks may be detected by detection of defocus characteristics of the obtained images.

Next, the method for detecting the relative position of the chuck mark 8 to the wafer alignment mark 9 will be described with reference to FIGS. 4 and 5.

Figure 4:
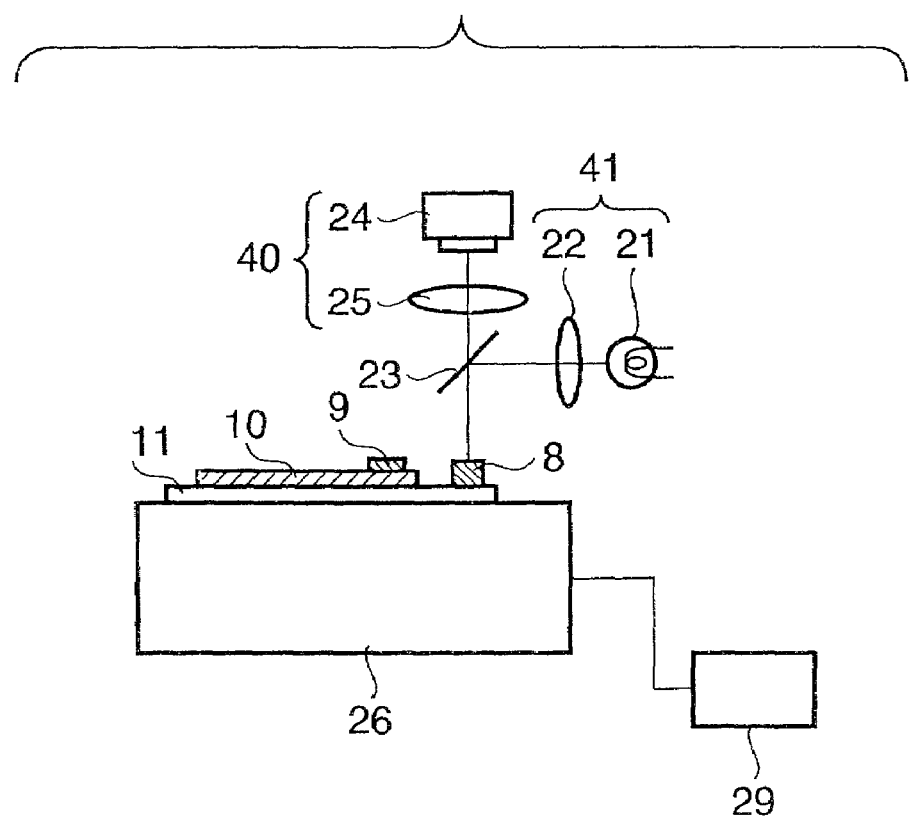
FIG. 4 is a schematic cross-sectional view showing detection of a chuck mark on a wafer chuck on a wafer stage in the embodiment.
Figure 5:
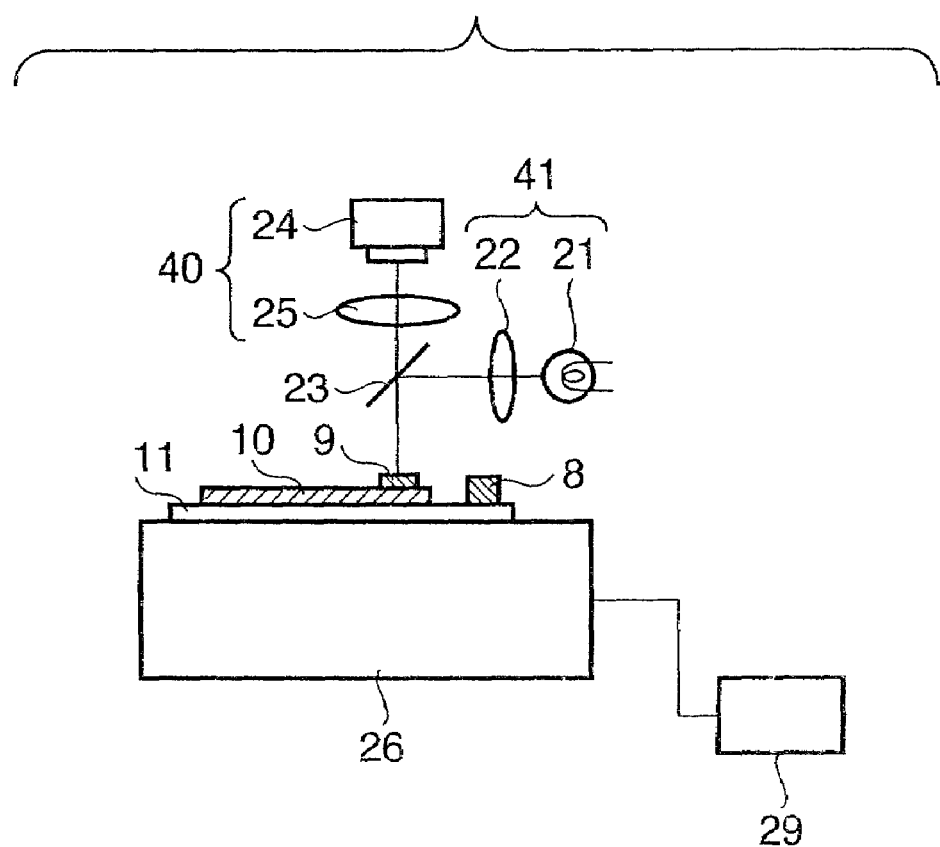
FIG. 5 is a schematic cross-sectional view showing detection of a wafer alignment mark on a wafer in the embodiment.
Figure 6:
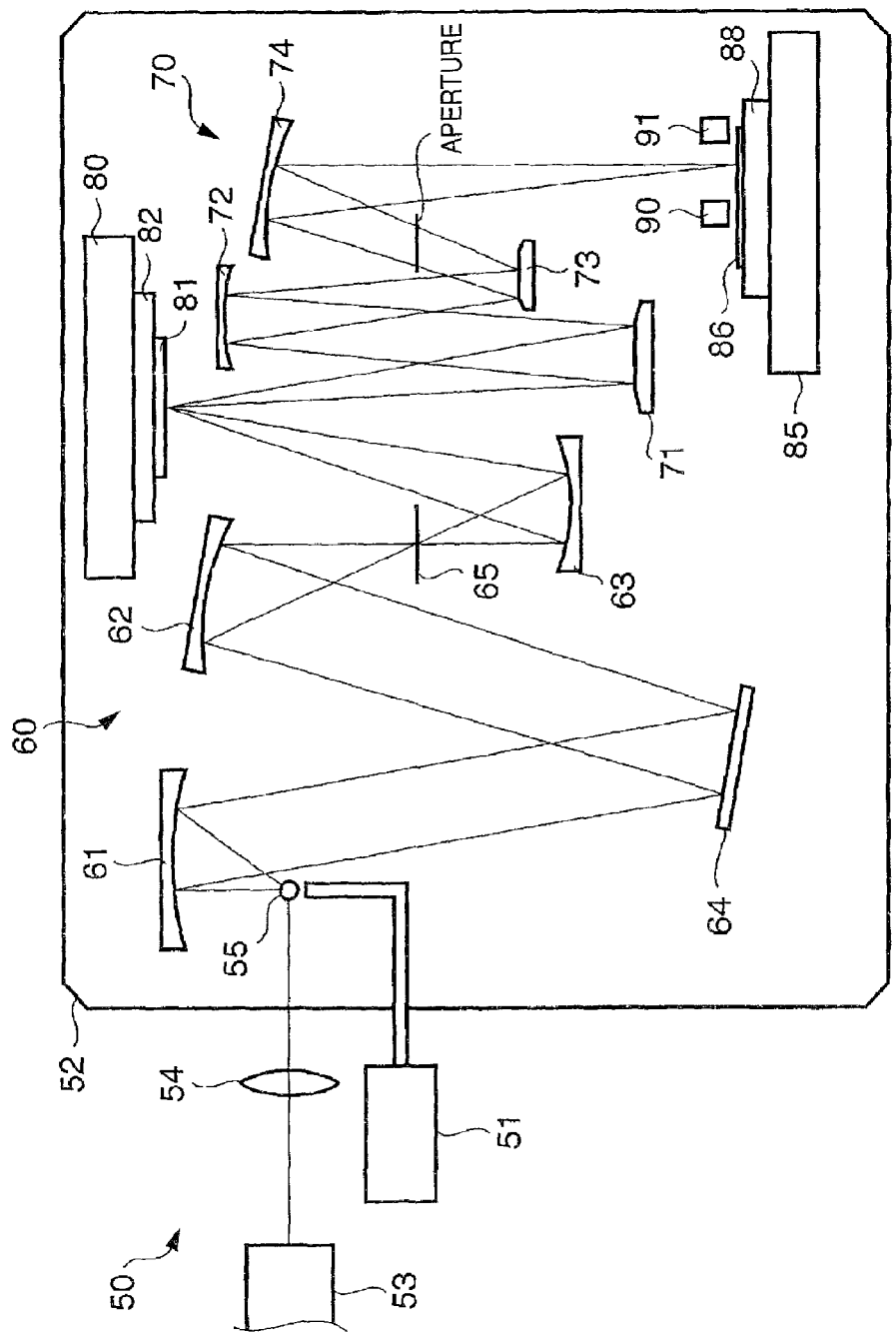
FIG. 6 is a schematic cross-sectional view of a position detection apparatus of the conventional art.

FIGS. 4 and 5 shows detection of the respective positions of the chuck mark 8 provided on the wafer chuck 11 provided on the wafer stage 12 and the wafer alignment mark 9 provided on the wafer 10, and the relative position of the chuck mark 8 to the wafer alignment mark 9.

Similarly to the second position detection optical system 30, the third position detection optical system 40 detects the positions of the marks 8 and 9 by receiving images of the respective marks and performing image processing on the received images, and detects the relative position of the chuck mark 8 to the wafer alignment mark 9 from the respective positional information.

First, the moving stage 26 carrying the chuck 11 is moved to the status in FIG. 4, plural (only one is shown in FIG. 4) chuck marks 8 provided on the chuck 11 are moved to the mark detection position of the third position detection optical system 40, reflected light from the illumination light of the third illumination optical system 41 is received by the third position detection optical system 40, the positions of the respective chuck marks 8 on the chuck 11 are detected by image processing, and the position of the moving stage 26 at that time is stored into a moving stage position storage device 29.

Next, the moving stage 26 is further moved to the status in FIG. 5, plural (only one is shown in FIG. 5) wafer alignment marks 9 corresponding to plural exposure shots provided on the wafer 10 held on the chuck 11 are moved to the mark detection position of the third position detection optical system 40, the reflected light from the illumination light of the third illumination optical system 41 is received by the third position detection optical system 40, the positions of the respective wafer alignment marks 9 on the wafer 10 are detected by image processing, and the position of the moving stage 26 at that time is stored into the moving stage position storage device 29.

Then, the relative position of the chuck mark 8 to the wafer alignment mark 9 is detected from the positional information of the moving stage 26 upon detection of the respective marks detected by the third position detection optical system 40.

By the above procedure, the position of the reticle alignment mark 6, upon detection of the relative position of the reticle 5 to the wafer 10, can be detected by using the positional information of the reticle stage reference mark 3 detected on-axis in the same position of that of the exposure position. Similarly, the position of the wafer alignment mark 9 can be detected by using the positional information of the chuck mark 8 detected on-axis in the same position of the exposure position via the multilayer mirror 7. The chuck mark 8 can be set in an arbitrary position on the chuck 11, further, a wafer to obtain high reflectivity to the illumination light can be selected. Thus, the freedom of design can be improved.

Further, when the relative position of the chuck mark 8 to the wafer alignment mark 9 is detected, the heights of the two marks can be detected by detection of defocus characteristics of the obtained images.

Next, a method for detecting the relative position of the reticle stage reference mark 3 to the chuck mark 8 and performing alignment therebetween, and performing exposure will be described. Note that general alignment and exposure are disclosed by, e.g., Japanese Patent Application Laid-Open No. 61-263127.

More particularly, before the pattern of the reticle 5 is exposure-transferred to the wafer 10, the relative position of the reticle stage reference mark 3 to the reticle alignment mark 6, and the relative position of the chuck mark 8 to the wafer alignment mark 9 are detected in advance, as described above, thereafter, the chuck 11 and the wafer 10 are conveyed onto the wafer stage 12 while the wafer 10 is held on the chuck 11 where the chuck mark 8 is provided.

Next, the reticle stage 4 and the wafer stage 12 are driven, thereby the reticle 5 and the wafer 10 are moved to the exposure position from the relative positions of the respective marks.

Then, the relative position of the reticle stage reference mark 3 provided on the reticle 5 to the chuck mark 8 is detected by the first position detection optical system 1 and the first illumination optical system 2 on-axis in the same position of the exposure position. Then, the reticle stage 4 and the wafer stage 12 are driven based on the positional information on the previously-detected relative position of the reticle stage reference mark 3 to the reticle alignment mark 6, and the relative position of the chuck mark 8 to the wafer alignment mark 9, thereby, the reticle 5 and the wafer 10 are aligned with each other in a desired position.

Thereafter, in a status wherein the plate and the substrate are aligned with each other, an exposure controller (not shown) emits exposure light from the light source, thereby, the plate pattern is exposure-transferred onto the substrate. Note that the exposure light is EUV light having a wavelength of about 10 to 15 nm.

By this method, position detection for alignment and exposure are performed in parallel, and the limitation on the alignment detection optical system and projection optical system can be omitted in many cases. Thus, various alignment detection optical systems can be constructed, and high throughput with stable detection rate and high precision can be realized for various wafer processes.

Further, as the on-axis TTL alignment optical system is employed as the detection optical system for detection of the relative position of the reticle stage reference mark 3 to the chuck mark 8 in the exposure apparatus, there is no baseline, and the factor of degradation of detection precision can be eliminated.

Embodiment of a Semiconductor Production System

Next, an example of a semiconductor device (e.g., semiconductor chip of IC, LSI, or the like, a liquid crystal panel, a CCD, a thin film magnetic head, a micromachine, etc.) production system using the apparatus of the present invention will be described. The system performs maintenance services such as trouble-shooting, periodical maintenance or software delivery for fabrication apparatuses installed in a semiconductor manufacturing factory, by utilizing a computer network outside the fabrication factory.

Figure 7:
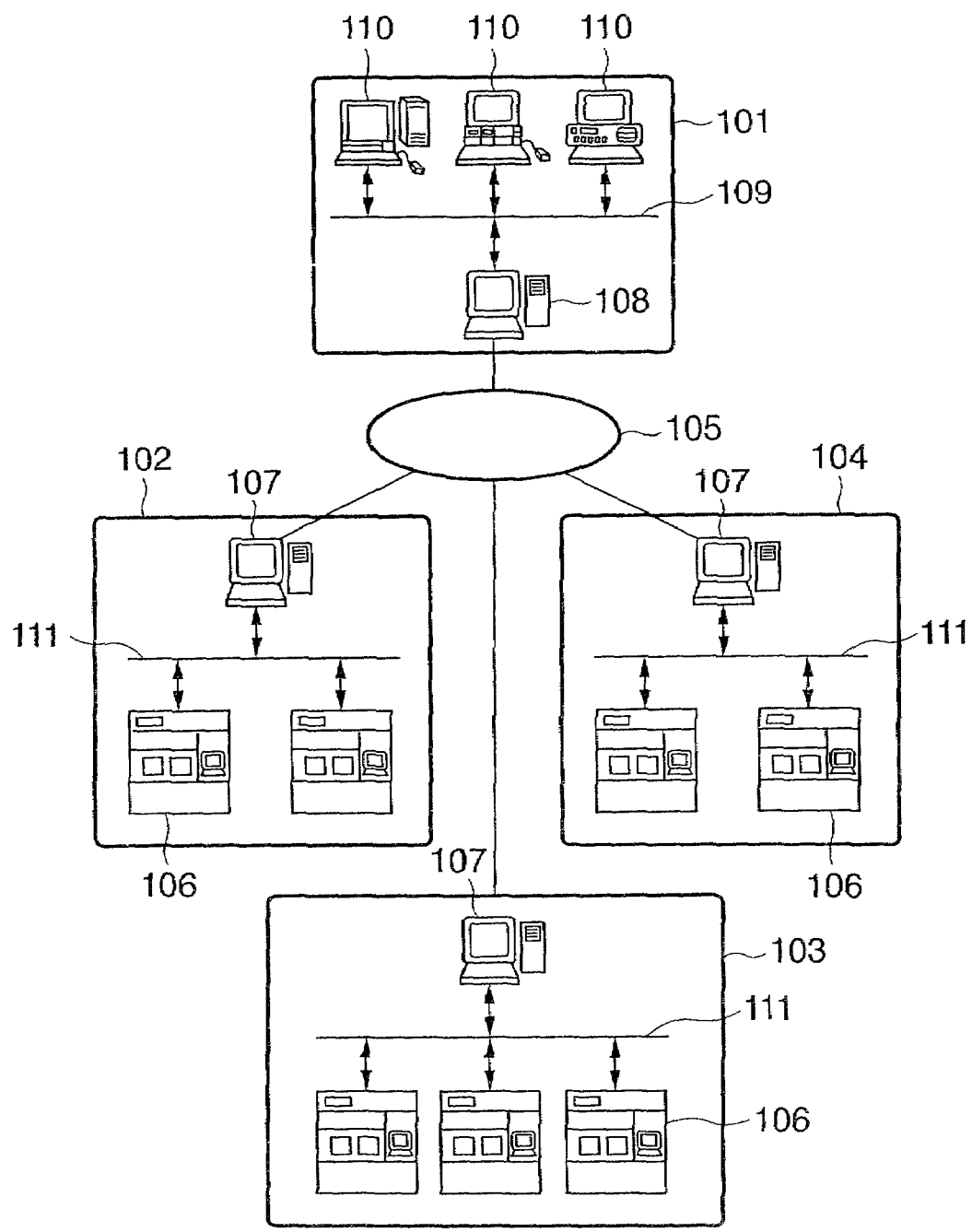
FIG. 7 is a conceptual diagram of a semiconductor device production system using the apparatus according to the embodiment, viewed from an angle.

FIG. 7 shows the entire system cut out from an angle. In the figure, numeral 101 denotes the office of a vendor (apparatus maker) of semiconductor device fabrication apparatuses, apparatuses in the semiconductor fabrication factory for performing various processes such as preprocess apparatuses (e.g., lithography apparatuses including an exposure apparatus, a resist processing apparatus and an etching apparatus, a heat processing apparatus, a film forming apparatus, a smoothing apparatus and the like) and postprocess apparatuses (e.g., an assembly apparatus, an inspection apparatus and the like) are used. The office 101 has a host management system 108 to provide a maintenance database for the fabrication apparatus, plural operation terminal computers 110, and a local area network (LAN) 109 connecting them to construct an Intranet or the like. The host management system 108 has a gateway for connection between the LAN 109 and the Internet 105 as an external network and a security function to limit access from the outside.

On the other hand, numerals 102 to 104 denote fabrication factories of semiconductor makers as users of the fabrication apparatuses. The fabrication factories 102 to 104 may belong to different makers or may belong to the same maker (e.g., preprocess factories and postprocess factories). The respective factories 102 to 104 are provided with plural fabrication apparatuses 106, a local area network (LAN) 111 connecting the apparatuses to construct an Intranet or the like, and a host management system 107 as a monitoring apparatus to monitor operating statuses of the respective fabrication apparatuses 106. The host management system 107 provided in the respective factories 102 to 104 has a gateway for connection between the LAN 111 and the Internet 105 as the external network. In this arrangement, the host management system 108 on the vendor side can be accessed from the LAN 111 in the respective factories via the Internet 105, and only limited user(s) can access the system by the security function of the host management system 108. More particularly, status information indicating the operating statuses of the respective fabrication apparatuses 106 (e.g., a problem of a fabrication apparatus having trouble) is notified from the factory side to the vendor side via the Internet 105, and maintenance information such as response information to the notification (e.g., information indicating a measure against the trouble, or remedy software or data), latest software, help information, and the like, is received from the vendor side via the Internet. The data communication between the respective factories 102 to 104 and the vendor 101 and data communication in the LAN 111 of the respective factories are performed by using a general communication protocol (TCP/IP). Note that as the external network, a private-line network (e.g., an ISDN or the like) with high security against access from outsiders may be used in place of the Internet.

Further, the host management system is not limited to that provided by the vendor, but a database constructed by the user may be provided on the external network, to provide the plural user factories with access to the database.

Figure 8:
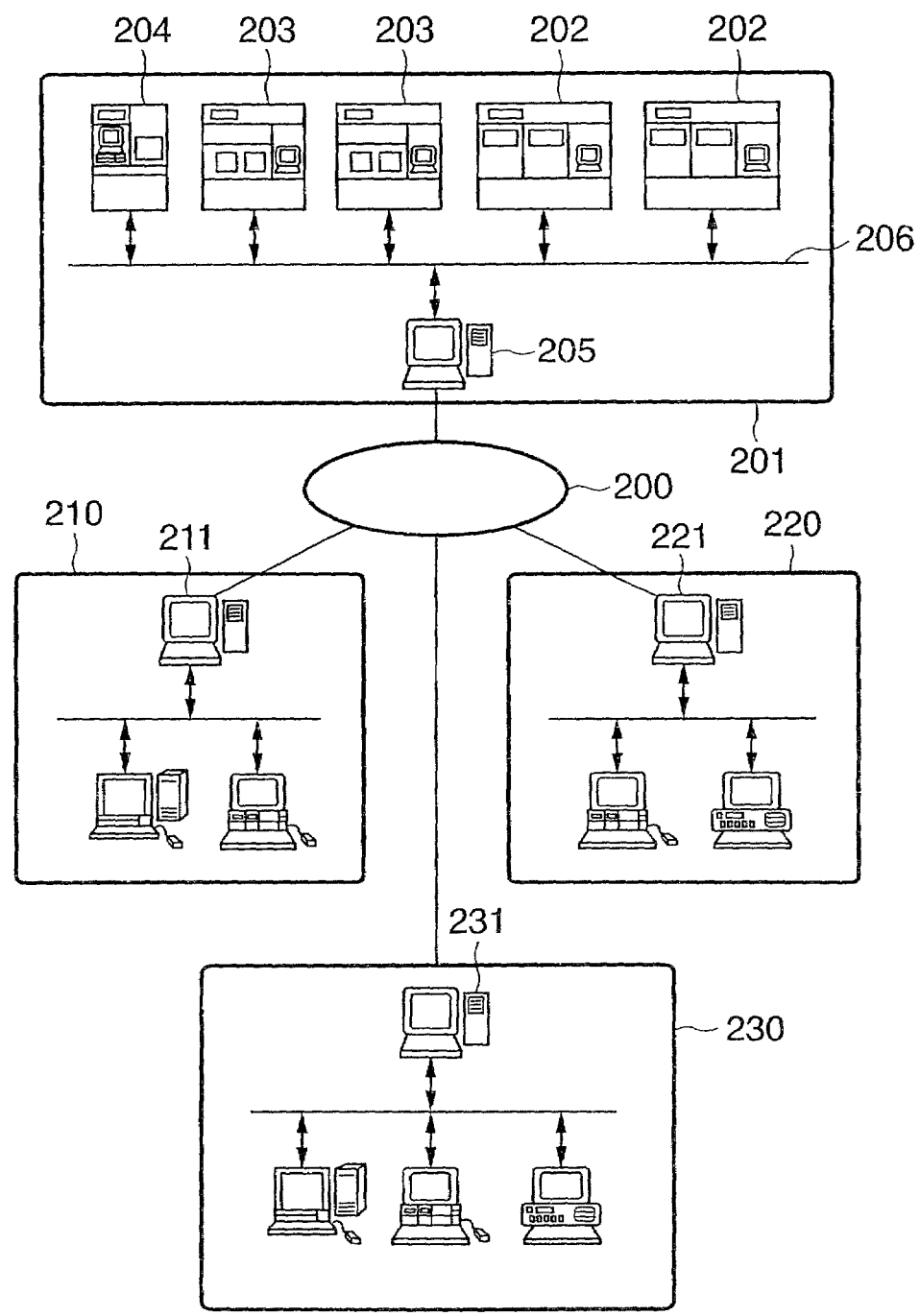
FIG. 8 is a conceptual diagram of the semiconductor device production system using the apparatus according to the embodiment, viewed from another angle.

FIG. 8 is a conceptual diagram showing the entire system of the present embodiment cut out from another angle different from that in FIG. 7. In the above example, the plural user factories respectively having fabrication apparatuses and the management system of the apparatus vendor are connected via the external network, and data communication is performed for production management for the respective factories and transmission of information on at least one fabrication apparatus. In this example, a factory having fabrication apparatuses of plural vendors is connected with management systems of the respective vendors of the fabrication apparatuses via the external network, and data communication is performed for transmission of maintenance information for the respective fabrication apparatuses. In the figure, numeral 201 denotes a fabrication factory of a fabrication apparatus user (semiconductor device maker). In the factory fabrication line, fabrication apparatuses for performing various processes, an exposure apparatus 202, a resist processing apparatus 203 and a film forming apparatus 204, are used. Note that FIG. 8 shows only the fabrication factory 201, however, actually, plural factories construct the network. The respective apparatuses of the factory are connected with each other by a LAN 206 to construct an Intranet, and a host management system 205 performs operation management of the fabrication line.

On the other hand, the respective offices of vendors (apparatus makers), an exposure apparatus maker 210, a resist processing apparatus maker 220, and a film forming apparatus maker 230 have host management systems 211, 221 and 231 for performing remote maintenance for the apparatuses, and as described above, the systems have the maintenance database and the gateway for connection to the external network. The host management system 205 for management of the respective apparatuses in the user fabrication factory is connected with the respective vendor management systems 211, 221 and 231 via the Internet or private-line network as an external network 200. In this system, if one of the fabrication apparatuses of the fabrication line has trouble, the operation of the fabrication line is stopped. However, the trouble can be quickly removed by receiving the remote maintenance service from the vendor of the apparatus via the Internet 200, thus, the stoppage of the fabrication line can be minimized.

The respective fabrication apparatuses installed in the semiconductor fabrication factory have a display, a network interface and a computer to execute network access software stored in a memory and device operation software. As a memory, an internal memory, a hard disk or a network file service may be used. The network access software, including a specialized or general web browser, provides a user interface screen image as shown in FIG. 9 on the display. An operator who manages the fabrication apparatuses in the factory checks the screen image and inputs information of the fabrication apparatus, a model 401, a serial number 402, a trouble case name 403, a date of occurrence of trouble 404, an emergency level 405, a problem 406, a remedy 407 and a progress 408, into input fields on the screen image. The input information is transmitted to the maintenance database via the Internet, and appropriate maintenance information as a result is returned from the maintenance database and provided on the display. Further, the user interface provided by the web browser realizes hyper link functions 410 to 412 as shown in the figure, and the operator accesses more detailed information of the respective items, downloads latest version software to be used in the fabrication apparatus from a software library presented by the vendor, and downloads operation guidance (help information) for the operator's reference. The maintenance information provided from the maintenance database includes the information on the above-described present invention, and the software library provides latest version software to realize the present invention.

Figure 10:
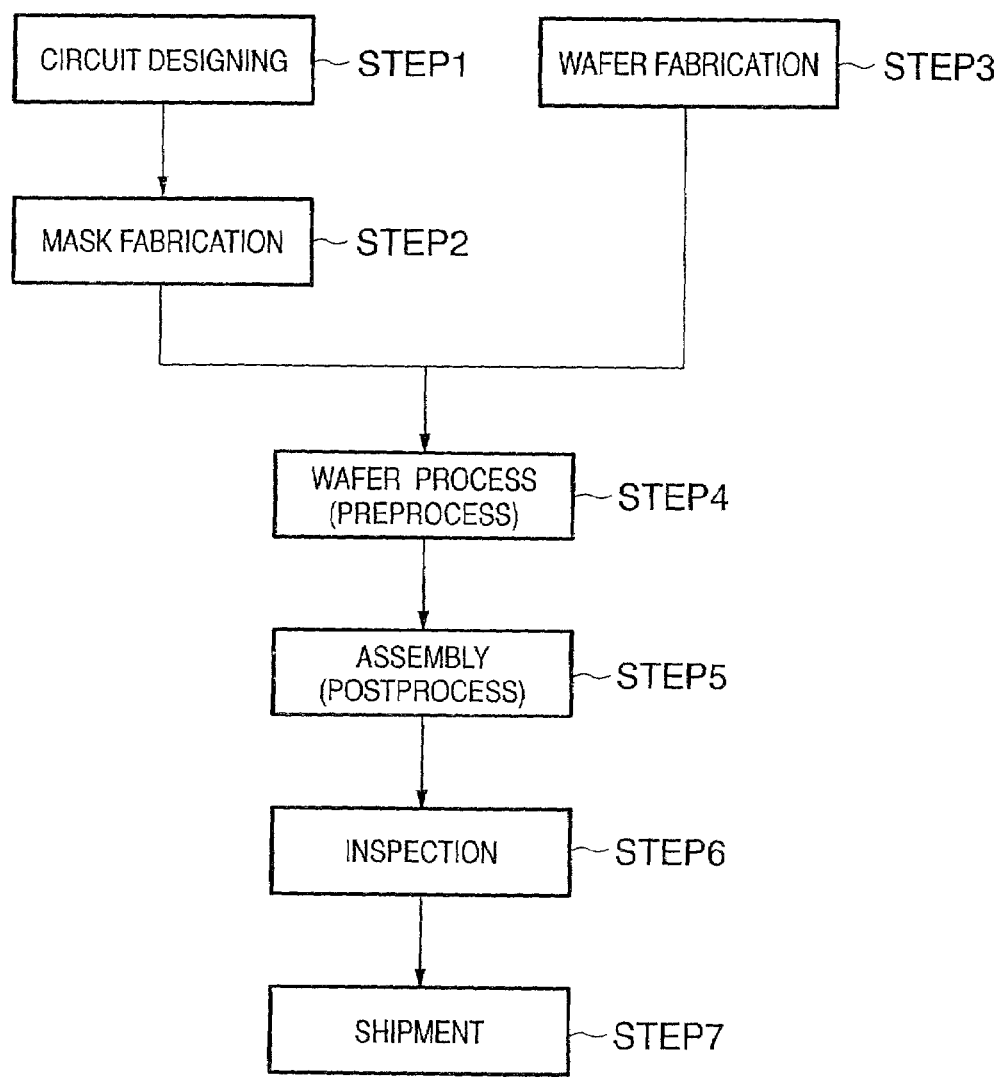
FIG. 10 is a flowchart showing a device fabrication process.

Next, a semiconductor device fabrication process utilizing the above-described production system will be described. FIG. 10 shows a flow of the entire semiconductor fabrication process. At step 1 (circuit designing), a circuit designing of the semiconductor device is performed. At step 2 (mask fabrication), a mask where the designed circuit pattern is formed is fabricated. On the other hand, at step 3 (wafer fabrication), a wafer is fabricated using silicon or the like. At step 4 (wafer process), called a preprocess, the above mask and wafer are used. An actual circuit is formed on the wafer by lithography. At step 5 (assembly), called a postprocess, a semiconductor chip is formed by using the wafer at step 4. The postprocess includes processing such as an assembly process (dicing and bonding) and a packaging process (chip sealing). At step 6 (inspection), inspections such as an operation test and a durability test are performed on the semiconductor device assembled at step 5. The semiconductor device is completed through these processes, and it is shipped (step 7). The preprocess and postprocess are independently performed in specialized factories, and maintenance is made for these factories by the above-described remote maintenance system. Further, data communication is performed for production management and/or apparatus maintenance between the preprocess factory and the postprocess factory via the Internet or private-line network.

Figure 11:
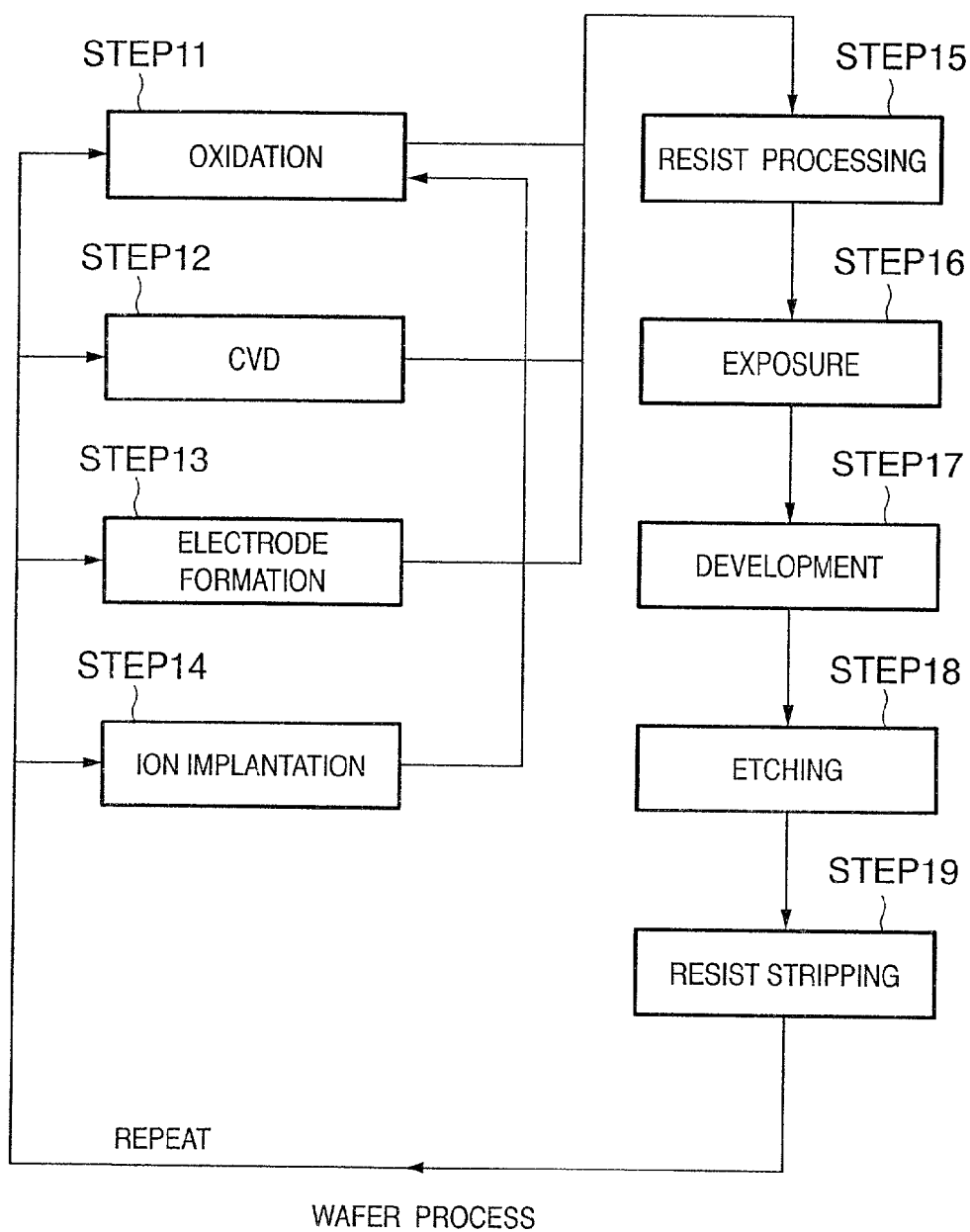
FIG. 11 is a flowchart showing a wafer process.

FIG. 11 shows a more detailed flow of the wafer process. At step 11 (oxidation), the surface of the wafer is oxidized. At step 12 (CVD), an insulating film is formed on the surface of the wafer. At step 13 (electrode formation), electrodes are formed by vapor deposition on the wafer. At step 14 (ion implantation), ions are injected into the wafer. At step 15 (resist processing), the wafer is coated with photoresist. At step 16 (exposure), the above-described exposure apparatus exposure-transfers the circuit pattern of the mask onto the wafer. At step 17 (development), the exposed wafer is developed. At step 18 (etching), portions other than the resist image are etched. At step 19 (resist stripping), the resist unnecessary after the etching is removed. These steps are repeated, thereby, multiple circuit patterns are formed on the wafer. As maintenance is performed on the fabrication apparatuses used in the respective steps by the above-described remote maintenance system, trouble is prevented, and even if it occurs, quick recovery can be made. In comparison with the conventional art, the productivity of the semiconductor device can be improved.

As described above, according to the present embodiment, in an EUV exposure apparatus, for example, relative alignment between a plate and a substrate can be performed by using a plate stage reference mark in which high reflectivity can be comparatively easily set with respect to alignment illumination light and which provides positional reference of the plate stage and a chuck mark on a chuck as alignment marks. Thus, alignment illumination light with a high S/N ratio can be obtained. Especially, in a case wherein the present invention is applied to the TTL method, an on-axis TTL detection method is used in the off-axis detection, there is no so-called baseline. Accordingly, high precision alignment can be performed between a reticle or the like and a wafer or the like without expensive parts.

Another Embodiment

The present invention includes a case wherein the object of the present invention also can be achieved by providing a software program for performing the functions of the above-described embodiments to a system or an apparatus from a remote position, and reading and executing the program code with a computer of the system or apparatus. In such a case, the form of the software is not necessarily a program as long as it has a function of a program.

Accordingly, to realize the functional processing of the present invention by the computer, the program code itself installed in the computer realizes the present invention. That is, the claims of the present invention include a computer program itself to realize the functional processing of the present invention.

In such a case, another form of a program such as a program executed by an object code, an interpreter, and the like, or script data to be supplied to an OS (Operating System), may be used, as long as it has the function of a program.

As a storage medium for providing the program, a floppy disk, a hard disk, an optical disk, a magneto-optical disk, an MO, a CD-ROM, a CD-R, a CD-RW, a magnetic tape, a non-volatile type memory card, a ROM, a DVD (a DVD-ROM and a DVD-R), or the like, can be used.

Further, the program may be provided by accessing a home page on the Internet by using a browser of a client computer, and downloading the computer program itself of the present invention or a compressed file having an automatic installation function from the home page to a storage medium, such as a hard disk. Further, the present invention can be realized by dividing a program code construction of the program of the present invention into plural files, and downloading the respective files from different home pages. That is, the claims of the present invention also include a world wide web, WWW, server holding the program file to realize the functional processing of the present invention to be downloaded to plural users.

Further, the functional processing of the present invention can be realized by encrypting the program of the present invention and storing the encrypted program into a storage medium such as a CD-ROM, delivering the storage medium to users, permitting a user who satisfied a predetermined condition to download key information for decryption from the home page via the Internet, and the user executing the program by using the key information and installing the program into the computer.

Furthermore, besides the functions according to the above embodiments being realized by executing the need program by a computer, the present invention includes a case wherein an OS, or the like, working on the computer performs a part of or an entire actual processing in accordance with designations of the program code and realizes functions according to the above embodiments.

Furthermore, the present invention also includes a case wherein, after the program code read from the storage medium is written in a function expansion board, which is inserted into the computer or in a memory provided in a function expansion unit, which is connected to the computer, a CPU or the like contained in the function expansion board or unit performs a part of or an entire process in accordance with designations of the program code and realizes the functions of the above embodiments.

The present invention is not limited to the above embodiments and various changes and modifications can be made within the spirit and scope of the present invention. Therefore, to apprise the public of the scope of the present invention, the following claims are made.

The invention claimed is:

1. An exposure method for projecting a pattern formed on a reflection plate onto a substrate, via a projection optical system, using extreme ultraviolet light, said method comprising:
    a first detection step of detecting a relative position between a first mark formed on a substrate holding unit for holding the substrate and a second mark formed on a plate holding unit for holding the reflection plate, using non-exposure light, which travels via the first mark, the projection optical system and the second mark; and
    a second detection step of detecting a relative position between the second mark and a third mark formed on the reflection plate, said second detection step comprising sub-steps of:
    (i) detecting light reflected from the second mark with a detector,
    (ii) detecting light reflected from the third mark with the detector, and
    (iii) changing a relative position between the plate holding unit and the detector between said sub-steps (i) and (ii).

2. A method according to claim 1, wherein a fourth mark is provided on the substrate, and further comprising a third detection step which detects a relative position between the first mark and the fourth mark.

3. A method according to claim 1, wherein, in said first detection step, the first mark is detected on-axis with respect to an optical axis of the projection optical system.

4. A method according to claim 1, wherein the extreme ultraviolet light has a wavelength within 10 to 15 nm, and the substrate holding unit has a reflectivity, with respect to the non-exposure light, not less than 95%.

5. A method according to claim 1, wherein the reflection plate has a reflection portion of a multilayer structure.

6. A method according to claim 1, wherein the substrate holding unit has a substrate chuck for holding the substrate and the first mark is provided on the substrate chuck.

7. A method according to claim 6, wherein, in said first position detection step, the first and second marks are detected after the chuck holding the substrate is replaced.

8. An exposure apparatus for projecting a pattern formed on a reflection plate, held by a plate holding unit, onto a substrate using extreme ultraviolet exposure light, said apparatus comprising:
- a projection optical system which projects the pattern onto the substrate with the exposure light reflected from the reflection plate;
- a substrate holding unit which holds the substrate;
- a first detecting system which detects a relative position between a first mark formed on said substrate holding unit and a second mark formed on the plate holding unit, using non-exposure light which travels via the first mark, the projection optical system and the second mark; and
- a second detecting system which has a detector and detects a relative position between the second mark and a third mark formed on the reflection plate, wherein the second and third marks are detected at respective relative positions between said detector and the plate holding unit.

9. An apparatus according to claim 8, wherein a fourth mark is provided on the substrate, and said apparatus further comprises a third detecting system which detects a relative position between the first mark and the fourth mark.

10. An apparatus according to claim 8, wherein said first detecting system detects the first mark on-axis with respect to an optical axis of the projection optical system.

11. An apparatus according to claim 8, wherein the extreme ultraviolet light has a wavelength within 10 to 15 nm, and the substrate holding unit has a reflectivity, with respect to the non-exposure light, not less than 95%.

12. An apparatus according to claim 8, wherein the reflection plate has a reflection portion of a multilayer structure.

13. An apparatus according to claim 8, wherein said substrate holding unit has a substrate chuck for holding the substrate, and the first mark is provided on said substrate chuck.

14. An apparatus according to claim 13, wherein said first detecting system detects the second mark and the first mark after said substrate chuck is replaced.

15. A semiconductor device manufacturing method comprising steps of:
- projecting a pattern formed on a reflection plate onto a substrate using an exposure apparatus as recited in claim 8; and
- developing the substrate onto which the pattern has been projected in said projecting step.

* * * * *

UNITED STATES PATENT AND TRADEMARK OFFICE
CERTIFICATE OF CORRECTION

PATENT NO. : 7,067,826 B2
APPLICATION NO. : 10/151151
DATED : June 27, 2006
INVENTOR(S) : Takehiko Suzuki et al.

It is certified that error appears in the above-identified patent and that said Letters Patent is hereby corrected as shown below:

ON THE COVER PAGE:
In item "(57) ABSTRACT," the abstract should be deleted and the following inserted therefor:

-- An exposure method for exposing a pattern formed on a reflection plate onto a substrate via a projection optical system using extreme ultraviolet light. The method includes a first detection step which detects non-exposure light which is passed through a first mark formed on a substrate holding unit for holding the substrate, the projection optical system, and a second mark formed on a plate holding unit for holding the reflection plate, and a second detection step which detects a relative position of the second mark and a third mark formed on the reflection plate. The second detection step includes the sub-steps of detecting light reflected from the second mark with a detector, changing relative position of the plate holding unit and the detector, and detecting light reflected from the third mark with the detector. --

Signed and Sealed this

Second Day of January, 2007

JON W. DUDAS
*Director of the United States Patent and Trademark Office*